(12) United States Patent
Yang

(10) Patent No.: US 9,303,928 B2
(45) Date of Patent: Apr. 5, 2016

(54) THERMAL CONDUCTION PRINCIPLE AND DEVICE FOR INTERCROSSED STRUCTURE HAVING DIFFERENT THERMAL CHARACTERISTICS

(76) Inventor: Tai-Her Yang, Dzan-Hwa (TW)

( * ) Notice: Subject to any disclaimer, the term of this patent is extended or adjusted under 35 U.S.C. 154(b) by 735 days.

(21) Appl. No.: 12/607,396

(22) Filed: Oct. 28, 2009

(65) Prior Publication Data
US 2010/0143619 A1 Jun. 10, 2010

Related U.S. Application Data

(63) Continuation-in-part of application No. 12/219,475, filed on Jul. 23, 2008, and a continuation-in-part of application No. 12/232,278, filed on Sep. 15, 2008.

(51) Int. Cl.
| | | |
|---|---|---|
| H05K 7/20 | (2006.01) |
| B32B 3/10 | (2006.01) |
| H01L 23/373 | (2006.01) |
| B32B 7/00 | (2006.01) |
| F28F 13/00 | (2006.01) |
| A47J 27/00 | (2006.01) |
| A47J 27/022 | (2006.01) |
| A47J 36/02 | (2006.01) |
| F28F 21/08 | (2006.01) |
| F28F 23/00 | (2006.01) |
| H01L 23/36 | (2006.01) |
| H01L 23/367 | (2006.01) |
| F28F 13/14 | (2006.01) |
| F28F 13/18 | (2006.01) |

(52) U.S. Cl.
CPC ............... *F28F 13/00* (2013.01); *A47J 27/002* (2013.01); *A47J 27/022* (2013.01); *A47J 36/02* (2013.01); *F28F 21/08* (2013.01); *F28F 23/00* (2013.01); *H01L 23/36* (2013.01); *H01L 23/3677* (2013.01); *H01L 23/373* (2013.01); *H01L 23/3735* (2013.01); *F28F 13/14* (2013.01); *F28F 13/18* (2013.01); *F28F 2013/006* (2013.01); *H01L 2924/0002* (2013.01); *Y10T 428/13* (2015.01)

(58) Field of Classification Search
CPC .................................. A47J 36/02; F28F 13/00
USPC ........................................................ 428/195.1
See application file for complete search history.

(56) References Cited

U.S. PATENT DOCUMENTS

| | | | | |
|---|---|---|---|---|
| 2,040,102 | A * | 5/1936 | Peron | 126/390.1 |
| 4,596,236 | A * | 6/1986 | Eide | 219/621 |
| 5,367,607 | A * | 11/1994 | Hufnagl et al. | 392/465 |
| 5,990,552 | A * | 11/1999 | Xie et al. | 257/718 |
| 2004/0011508 | A1 * | 1/2004 | Tan et al. | 165/80.3 |
| 2005/0013119 | A1 * | 1/2005 | Misra | 361/704 |
| 2006/0117539 | A1 * | 6/2006 | Alim | 29/17.3 |

* cited by examiner

*Primary Examiner* — Ian Rummel
(74) *Attorney, Agent, or Firm* — Bacon & Thomas, PLLC

(57) ABSTRACT

The present invention relates to relay thermal conductor made of material having better thermal conductivity coefficient, wherein which is thermal conductively coupled with heating or cooling first thermal body at one end or face thereof, and is coupled with interface thermal conductor having higher specific heat capacity at the other end or face thereof; the relay thermal conductor directly performs thermal conduction with second thermal body at another part thereof; and the interface thermal conductor having higher specific heat capacity is the thermal conducting carrier between the relay thermal conductor and the second thermal body.

9 Claims, 7 Drawing Sheets

FIG. 10
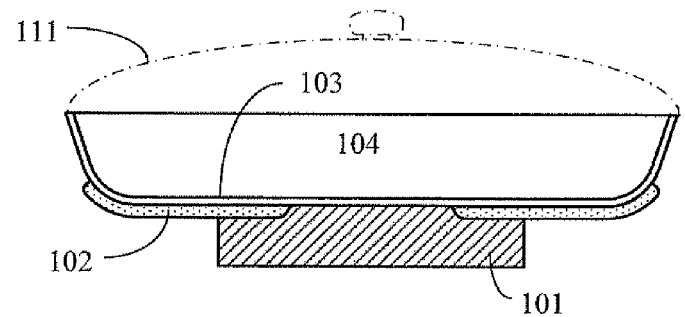
FIG. 11
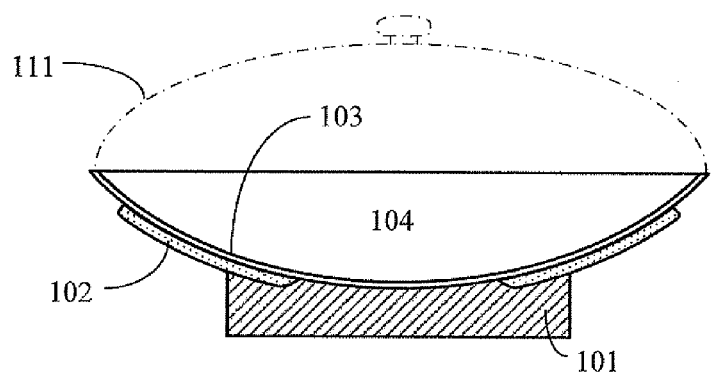
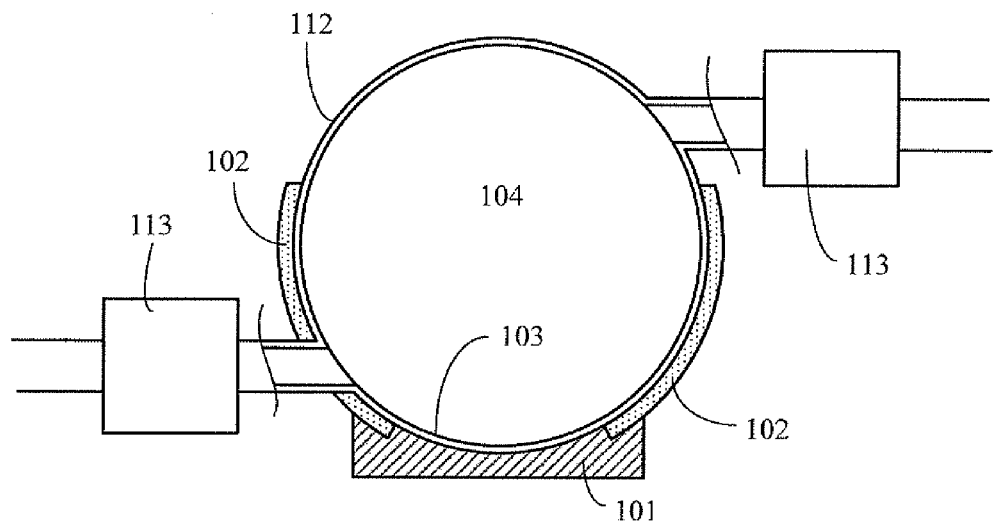
FIG. 12

THERMAL CONDUCTION PRINCIPLE AND DEVICE FOR INTERCROSSED STRUCTURE HAVING DIFFERENT THERMAL CHARACTERISTICS

CROSS-REFERENCE TO RELATED APPLICATION

This application is a Continuation-In-Part of U.S. patent application Ser. No. 12/219,475, filed Jul. 23, 2008 and Ser. No. 12/232,278, filed Sep. 15, 2008.

BACKGROUND OF THE INVENTION (a) Field of the Invention

The present invention discloses that at least two layers of thermal energy conducting structures in particular intercrossed overlapping layers embodiment are commonly constituted by at least two thermal energy conductive material having at least one of different thermal conductivity coefficient, specific heat capacity, or thermal emissivity, thereby promoting the thermal conducting effect.

(b) Description of the Prior Art

The cooling or heating source of the first thermal body of the conventional thermal conducting structure constituted by a single material is usually limited by the smaller thermally conducting area of the thermal conducting device, such as that if the heat source of first thermal body is the thermal energy of the heat loss in CPU of computer, or power semiconductor, or light emitting diode (LED), except for heat pipe or other cooling or heating device of the like having full area contact in the enclosed space, then if it is coupled with said thermal bodies for heat dissipating operation, if the thermal conducting structure is made of single material, and even if the thermal conductivity coefficient of the single material is better, its specific heat capacity is usually not the best, such as that the heat dissipater of CPU, power semiconductor, or light emitting diodes being made of copper material is heavier and expensive, and it has a better thermal conductivity coefficient, but its specific heat capacity is lower than aluminum.

If single material of better specific heat capacity with lighter weight and lower price is adopted, such as the heat dissipater of CPU, power semiconductor or light emitting diode being made of aluminum, it has higher specific heat capacity and thermal emissivity, but its thermal conductivity coefficient is lower than that of copper material, therefore the thermal conducting effect for thermal conducting structure made of single material is more limited.

SUMMARY OF THE INVENTION

The present invention innovatively discloses a thermal conduction principle and device for intercrossed structure having different thermal characteristics, wherein the thermal conducting structure of the particular intercrossed overlapping layer construction is made of materials with different thermal conducting characteristics and is different from the conventional thermal conducting device being made of single material, the relay thermal conductor of the thermal conduction principle and device for intercrossed structure having different thermal characteristics being made of material with better thermal conductivity coefficient is thermal conductively coupled with the heating or cooling first thermal body at one end or surface thereof, and is coupled with interface thermal conductor at the other end or face thereof, and the other portion is for directly thermal conduct with the second thermal body, and the interface thermal conductor having the thermal conducting characteristics with all or at least one of the 1) higher specific heat capacity relative to relay thermal conductor, or 2) a better thermal conductivity coefficient to second thermal body relative to relay thermal conductor, or 3) a better thermal emissivity to second thermal body relative to relay thermal conductor being good is used as the thermal conducting carrier between the relay thermal conductor and the second thermal body, and is favorable for thermal energy conduction by the particular intercrossed overlapping layer construction having different thermal characteristics when there is temperature difference between the first thermal body and the second thermal body.

BRIEF DESCRIPTION OF THE DRAWINGS

FIG. 10 is a main structural schematic view showing that the intercrossed multi-layered structure of the present invention is partially cross-layered combined to be flat-bottomed cookware.

FIG. 11 is a main structural schematic view showing that the intercrossed multi-layered structure of the present invention is partially cross-layered combined to be round-bottomed cookware.

FIG. 12 is a main structural schematic view showing that the intercrossed multi-layered structure of the present invention is partially cross-layered combined to be boiler plant.

DESCRIPTION OF MAIN COMPONENT SYMBOLS

Figure 1:
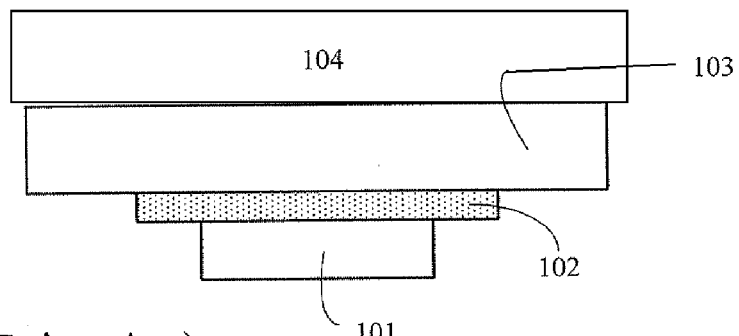
FIG. 1 is a schematic view of the three-layer type layer by layer overlapping structure principle of prior art.

101: First thermal body
102: Relay thermal conductor
103: Interface thermal conductor
104: Second thermal body
110: Thermal conductive interlayer
111: Liftable lid
112: Boiler plant
113: Fluid inlet/outlet interface of boiler plant

DETAILED DESCRIPTION OF THE PREFERRED EMBODIMENTS

The present invention innovatively discloses a thermal conduction principle and device for intercrossed structure having different thermal characteristics, wherein the thermal conducting structure of the particular intercrossed overlapping layer construction is made of materials with different thermal conducting characteristics and is different from the conventional thermal conducting device being made of single material, wherein the relay thermal conductor of the thermal conduction principle and device for intercrossed structure having different thermal characteristics of the present invention being made of material with better thermal conductivity coefficient is thermal conductively coupled with the heating or cooling first thermal body at one end or surface thereof, and is coupled with interface thermal conductor at the other end or surface thereof, wherein the relay thermal conductor directly perform thermal conduction with the second thermal body at another part thereof, wherein said interface thermal conductor having the thermal conducting characteristics with all or at least one of the 1) higher specific heat capacity relative to relay thermal conductor, or 2) a better thermal conductivity coefficient to second thermal body relative to relay thermal conductor, or 3) a better thermal emissivity to second thermal body relative to relay thermal conductor being good is used as the thermal conducting carrier between the relay thermal conductor and the second thermal body; and is favorable for thermal energy conduction by the particular intercrossed overlapping layer construction having different thermal characteristics when there is temperature difference between the first thermal body and the second thermal body.

For the thermal conduction principle and device for intercrossed structure having different thermal characteristics, besides the aforesaid layer by layer overlapping multi-layered structure, the multi-layered structure can be partially cross-layered combined under this basis to be the composing structure for thermal conduction to further promote the thermal conduction function; wherein it is described in the following:

FIG. 1 is a schematic view of the three-layer type layer by layer overlapping structure principle of prior art.

Figure 2:
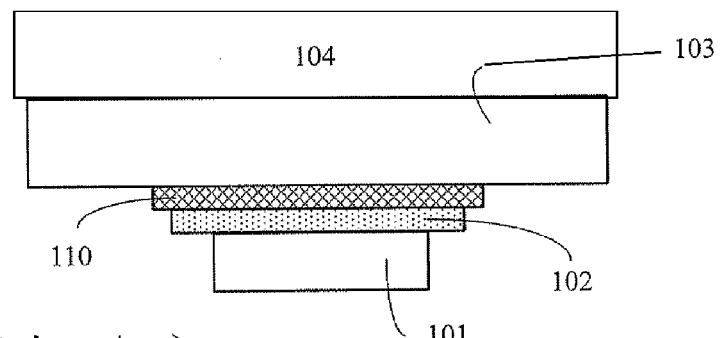
FIG. 2 is a schematic view of the structure principle showing that thermal conductive interlayer (110) is additionally installed between interface thermal conductor (103) and relay thermal conductor (102) in FIG. 1 of prior art.

FIG. 2 is a schematic view of the structure principle showing that thermal conductive interlayer (110) is additionally installed between interface thermal conductor (103) and relay thermal conductor (102) in FIG. 1 of prior art.

Aforementioned FIG. 1 and FIG. 2 are the basic architecture of the layer by layer overlapping multi-layer structure; As shown in FIG. 1, the heat source of first thermal body (101) is the thermal energy of heat loss in CPU of the computer, or power semiconductor, or light emitting diode (LED) which is not directly combined with the interface thermal conductor (103); as shown in FIG. 2, the heat source of the first thermal body (101) is the thermal energy of heat loss in CPU of the computer, or power semiconductor, or light emitting diode (LED) which is not directly combined with the thermal conductive interlayer (110) or the interface thermal conductor (103), and the relay thermal conductor (102) and the interface thermal conductor (103) also are not directly combined; hence, based on application requirements as well as manufacture and space considerations, the structure can be further promoted by partially cross-layered combining the multi-layered structure to be the composing structure for thermal conduction, i.e under the basis of FIG. 1, the thermal conducting surface of the first thermal body (101) is not only combined with the relay thermal conductor (102), but also partially combined with the interface thermal conductor (103), wherein the position of thermal conducting surfaces of the first thermal body (101) for combining with the relay thermal conductor (102) and the interface thermal conductor (103) can be selected according to thermal flow distribution of temperature difference and application conditions.

Figure 3:
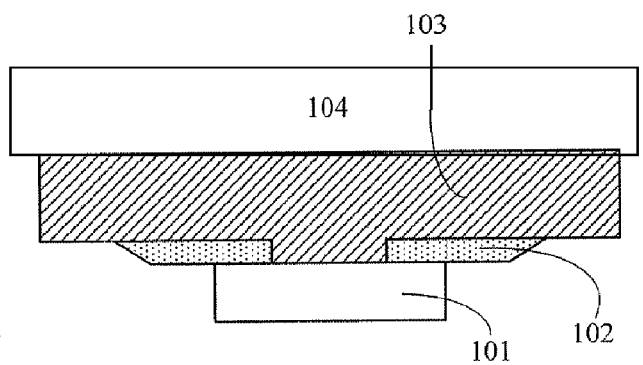
FIG. 3 is a schematic view showing that the multi-layered structure of the present invention is partially cross-layered combined to be thermal conductive composing structure.

FIG. 3 is a schematic view showing that the multi-layered structure of the present invention is partially cross-layered combined to be thermal conductive composing structure.

Structure characteristics of cross-layer combination as shown in FIG. 3 are the following:

the thermal conducting surface of the first thermal body (101) is partially combined with the relay thermal conductor (102), and partially combined with the interface thermal conductor (103);

the thermal conducting surface of the relay thermal conductor (102) is partially combined with the first thermal body (101), and partially combined with the interface thermal conductor (103);

the thermal conducting surface of the interface thermal conductor (103) is partially coupled with the second thermal body (104); and the conductive area, thickness and thermal characteristics of thermal conductive material of each cross-layer combined surface and original multi-layer combined surface can be selected according to thermal flow distribution of temperature difference and application conditions; and the first thermal body (101) can be the heat source or heat absorbing body; and the second thermal body (104) can be the heat absorbing body or heat source.

Figure 4:
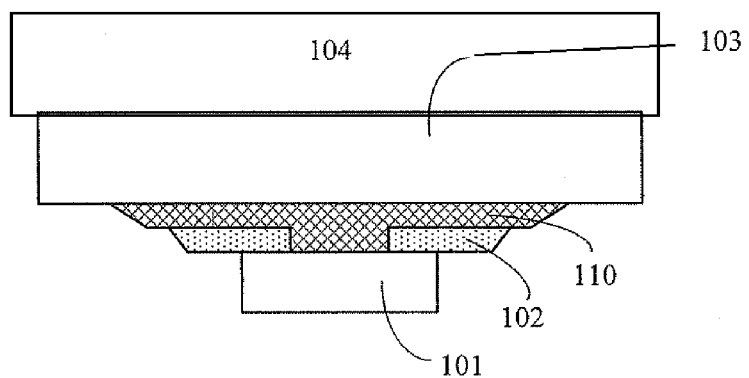
FIG. 4 is the first schematic view showing that the multi-layered structure of the present invention is partially cross-layered combined to be thermal conductive composing structure.

FIG. 4 is the first schematic view showing that the multi-layered structure of the present invention is partially cross-layered combined to be thermal conductive composing structure.

Structure characteristics of cross-layer combination as shown in FIG. 4 are the following:

the thermal conducting surface of the first thermal body (101) is partially combined with the relay thermal conductor (102), and partially combined with the thermal conductive interlayer (110);

the thermal conducting surface of the relay thermal conductor (102) is partially combined with the first thermal body (101), and partially combined with the thermal conductive interlayer (110);

the thermal conducting surface of the thermal conductive interlayer (110) is partially combined with the interface thermal conductor (103), partially combined with the relay thermal conductor (102), and partially combined with the first thermal body (101);

the thermal conducting surface of the interface thermal conductor (103) is partially combined with the thermal conductive interlayer (110), and partially coupled with the second thermal body (104); and the conductive area, thickness and thermal characteristics of thermal conductive material of each cross-layer combined surface and original multi-layer combined surface can be selected according to thermal flow distribution of temperature difference and application conditions; and the first thermal body (101) can be the heat source or heat absorbing body; and the second thermal body (104) can be the heat absorbing body or heat source.

Figure 5:
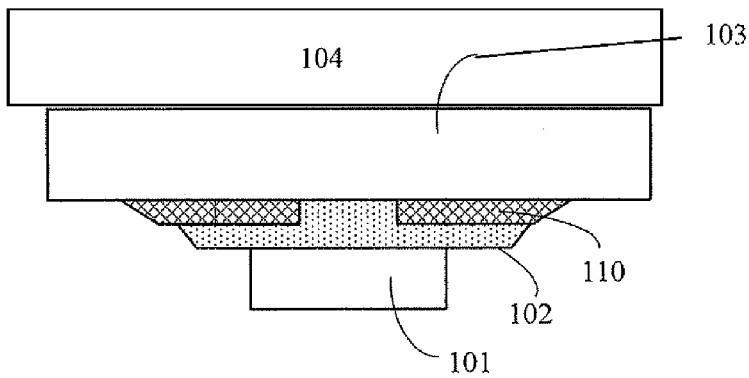
FIG. 5 is the second schematic view showing that the multi-layered structure of the present invention is partially cross-layered combined to be thermal conductive composing structure.

FIG. 5 is the second schematic view showing that the multi-layered structure of the present invention is partially cross-layered combined to be thermal conductive composing structure.

Structure characteristics of cross-layer combination as shown in FIG. 5 are the following:

the thermal conducting surface of the first thermal body (101) is combined with the relay thermal conductor (102);

the thermal conducting surface of the relay thermal conductor (102) is partially combined with the first thermal body (101), partially combined with the thermal conductive interlayer (110), and partially combined with the interface thermal conductor (103);

the thermal conducting surface of the thermal conductive interlayer (110) is partially combined with the interface thermal conductor (103), and partially combined with the relay thermal conductor (102);

the thermal conducting surface of the interface thermal conductor (103) is partially combined with the thermal conductive interlayer (110), partially combined with the relay thermal conductor (102), and partially coupled with the second thermal body (104); and the conductive area, thickness and thermal characteristics of thermal conductive material of each cross-layer combined surface and original multi-layer combined surface can be selected according to thermal flow distribution of temperature difference and application conditions; and the first thermal body (101) can be the heat source or heat absorbing body; and the second thermal body (104) can be the heat absorbing body or heat source.

Figure 6:
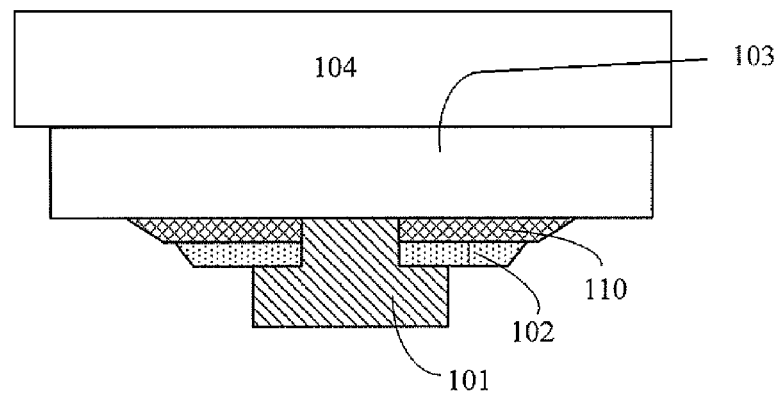
FIG. 6 is the third schematic view showing that the multi-layered structure of the present invention is partially cross-layered combined to be thermal conductive composing structure.

FIG. 6 is the third schematic view showing that the multi-layered structure of the present invention is partially cross-layered combined to be thermal conductive composing structure.

Structure characteristics of cross-layer combination as shown in FIG. 6 are the following:

the thermal conducting surface of the first thermal body (101) is partially combined with the relay thermal conductor (102), partially combined with the thermal conductive interlayer (110), and partially combined with the interface thermal conductor (103);

the thermal conducting surface of the relay thermal conductor (102) is partially combined with the first thermal body (101), and partially combined with the thermal conductive interlayer (110);

the thermal conducting surface of the thermal conductive interlayer (110) is partially combined with the interface thermal conductor (103), partially combined with the relay thermal conductor (102), and partially combined with the first thermal body (101);

the thermal conducting surface of the interface thermal conductor (103) is partially combined with the thermal conductive interlayer (110), partially combined with the first thermal body (101), and partially coupled with the second thermal body (104); and the conductive area, thickness and thermal characteristics of thermal conductive material of each cross-layer combined surface and original multi-layer combined surface can be selected according to thermal flow distribution of temperature difference and application conditions; and the first thermal body (101) can be the heat source or heat absorbing body; and the second thermal body (104) can be the heat absorbing body or heat source.

Figure 7:
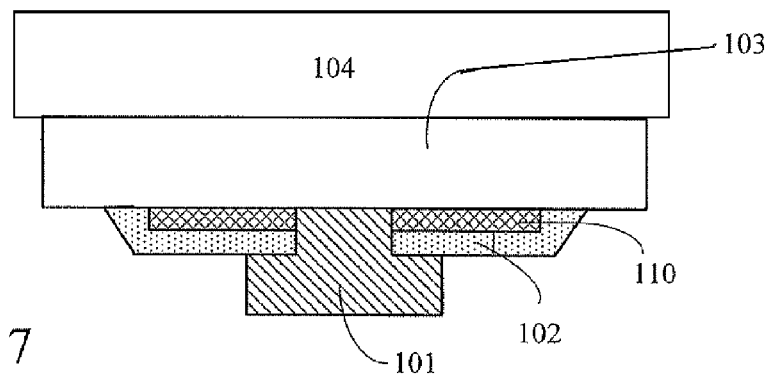
FIG. 7 is the fourth schematic view showing that the multi-layered structure of the present invention is partially cross-layered combined to be thermal conductive composing structure.

FIG. 7 is the fourth schematic view showing that the multi-layered structure of the present invention is partially cross-layered combined to be thermal conductive composing structure.

Structure characteristics of cross-layer combination as shown in FIG. 7 are the following:

the thermal conducting surface of the first thermal body (101) is partially combined with the relay thermal conductor (102), partially combined with the thermal conductive interlayer (110), and partially combined with the interface thermal conductor (103);

the thermal conducting surface of the relay thermal conductor (102) is partially combined with the first thermal body (101), partially combined with the thermal conductive interlayer (110), and partially combined with the interface thermal conductor (103);

the thermal conducting surface of the thermal conductive interlayer (110) is partially combined with the first thermal body (101), partially combined with the relay thermal conductor (102), and partially combined with the interface thermal conductor (103);

the thermal conducting surface of the interface thermal conductor (103) is partially combined with the first thermal body (101), partially combined with the relay thermal conductor (102), partially combined with the thermal conductive interlayer (110), and partially coupled with the second thermal body (104); and the conductive area, thickness and thermal characteristics of thermal conductive material of each cross-layer combined surface and original multi-layer combined surface can be selected according to thermal flow distribution of temperature difference and application conditions; and the first thermal body (101) can be the heat source or heat absorbing body; and the second thermal body (104) can be the heat absorbing body or heat source.

Figure 8:
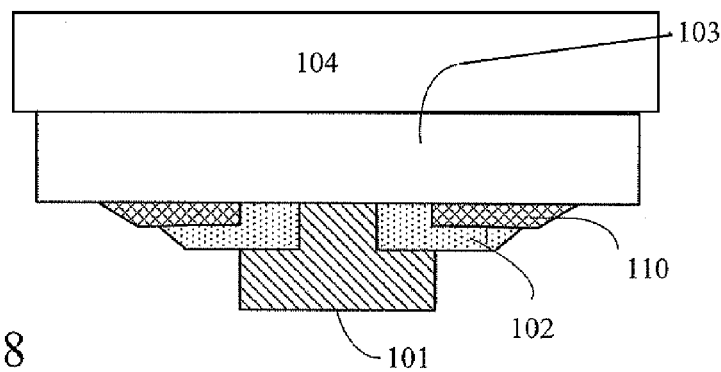
FIG. 8 is the fifth schematic view showing that the multi-layered structure of the present invention is partially cross-layered combined to be thermal conductive composing structure.

FIG. 8 is the fifth schematic view showing that the multi-layered structure of the present invention is partially cross-layered combined to be thermal conductive composing structure.

Structure characteristics of cross-layer combination as shown in FIG. 8 are the following:

the thermal conducting surface of the first thermal body (101) is partially combined with the relay thermal conductor (102), and partially combined with the interface thermal conductor (103);

the thermal conducting surface of the relay thermal conductor (102) is partially combined with the first thermal body (101), partially combined with the thermal conductive interlayer (110), and partially combined with the interface thermal conductor (103);

the thermal conducting surface of the thermal conductive interlayer (110) is partially combined with the relay thermal conductor (102), and partially combined with the interface thermal conductor (103); and the thermal conducting surface of the interface thermal conductor (103) is partially combined with the first thermal body (101), partially combined with the relay thermal conductor (102), partially combined with the thermal conductive interlayer (110), and partially coupled with the second thermal body (104); and the first thermal body (101) can be the heat source or heat absorbing body; and the second thermal body (104) can be the heat absorbing body or heat source.

Figure 9:
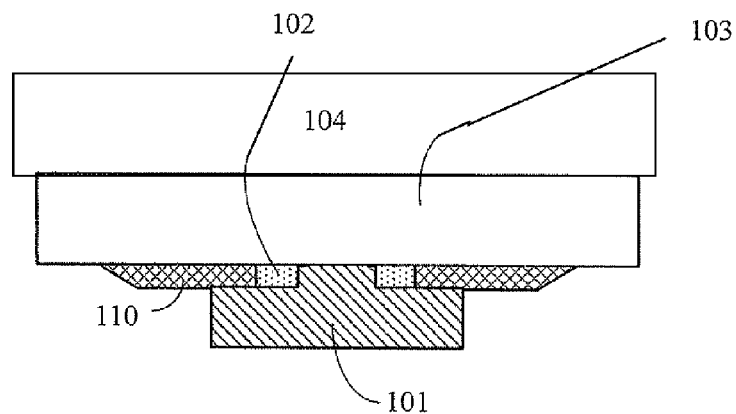
FIG. 9 is the sixth schematic view showing that the multi-layered structure of the present invention is partially cross-layered combined to be thermal conductive composing structure.

FIG. 9 is the sixth schematic view showing that the multi-layered structure of the present invention is partially cross-layered combined to be thermal conductive composing structure.

Structure characteristics of cross-layer combination as shown in FIG. 9 are the following:

the thermal conducting surface of the first thermal body (101) is partially combined with the relay thermal conductor (102), partially combined with the thermal conductive interlayer (110) and partially combined with the interface thermal conductor (103);

the thermal conducting surface of the relay thermal conductor (102) is partially combined with the first thermal body (101), partially combined with the thermal conductive interlayer (110), and partially combined with the interface thermal conductor (103);

the thermal conducting surface of the thermal conductive interlayer (110) is partially combined with the first thermal body (101), partially combined with the relay thermal conductor (102), and partially combined with the interface thermal conductor (103);

the thermal conducting surface of the interface thermal conductor (103) is partially combined with the first thermal body (101), partially combined with the relay thermal conductor (102), partially combined with the thermal conductive interlayer (110), and partially coupled with the second thermal body (104); and the conductive area, thickness and thermal characteristics of thermal conductive material of each cross-layer combined surface and original multi-layer combined surface can be selected according to thermal flow distribution of temperature difference and application conditions; and the first thermal body (101) can be the heat source or heat absorbing body; and the second thermal body (104) can be the heat absorbing body or heat source.

In case of more than one layer of the thermal conductive interlayer (110), the principle of cross-layer combination for the applications shown in FIGS. 3~9 can be similarly deduced.

For the thermal conduction principle and device for intercrossed structure having different thermal characteristics, the applications of the layer by layer overlapping multi-layer structure or the applications of the multi-layer structure being partially cross-layered combined can be made to various geometric shapes according to conditions of usage.

For the thermal conduction principle and device for intercrossed structure having different thermal characteristics, by way of specific structure of cross-layer combination by a portion of the intercrossed multi-layered structure, which can be applied for various appliances heated by thermal energy of external heat source, such as cookware, boiler, or water heater, besides the applications of heat dissipating or cooling purposes, wherein it is described in the following:

FIG. 10 is a main structural schematic view showing that the intercrossed multi-layered structure of the present invention is partially cross-layered combined to be flat-bottomed cookware.

As shown in FIG. 10, the main components include:

First thermal body (101): related to thermal energy source through conduction, and/or convection, and/or irradiation, wherein the first thermal body (101) is constituted by various flaming heat source device, or electric heat source device, or heat source device through induced heat body by electromagnetic effect or microwave effect (or the interface thermal conductor (103) composed of induced heat material by electromagnetic effect or microwave effect directly producing thermal energy), or heat source device through thermal fluid indirect transmission, or heat source device through solar energy or other natural thermal energy, for simultaneously heating the interface thermal conductor (103) and the relay thermal conductor (102), and then thermal energy is transmitted to the heated second thermal body (104) via the interface thermal conductor (103), on the other hand, through the simultaneously heated relay thermal conductor (102), thermal energy is diffused to the portion of the interface thermal conductor (103) not directly contacting with the first thermal body (101), so as to be transmitted to the heated second thermal body (104);

—Relay thermal conductor (102): made of material with higher thermal conductivity coefficient relative to the interface thermal conductor (103), including metal with better thermal conductivity such as gold, silver, copper, aluminum, etc., to be sandwiched in the portion of the interface thermal conductor (103) not directly contacting with the first thermal body (101), for further diffusing the thermal energy accepted by the interface thermal conductor (103) from the first thermal body (101) to the portion of the interface thermal conductor (103) not directly contacting with the first thermal body (101); and Interface thermal conductor (103): made of material suitable for contacting with the second thermal body (104) to transmit the thermal energy accepted from the first thermal body (101) to the second thermal body (104), including aluminum, iron, cast iron, stainless steel, ceramics, stone, gold, etc., for transmitting the thermal energy accepted from the first thermal body (101) to the second thermal body (104) in flat-bottomed cookware structure; wherein the interface thermal conductor (103) accepts the thermal energy directly transmitted from the first thermal body (101), and the thermal energy diffused from the portion of the relay thermal conductor (102) contacting with the first thermal body (101) is accepted by the portion of the interface thermal conductor (103) which does not directly contact with the first thermal body (101) but contacts with the relay thermal conductor (102); and wherein the above flat-bottomed cookware is not equipped with a lid, or equipped with a liftable lid (111); and by way of the above device, thermal energy is transmitted to the second thermal body (104) in liquid, solid, or gaseous state placed in the interface thermal conductor (103).

FIG. 11 is a main structural schematic view showing that the intercrossed multi-layered structure of the present invention is partially cross-layered combined to be round-bottomed cookware.

As shown in FIG. 11, the main components include:

First thermal body (101): related to thermal energy source through conduction, and/or convection, and/or irradiation, wherein the first thermal body (101) is constituted by various flaming heat source device, or electric heat source device, or heat source device through induced heat body by electromagnetic effect or microwave effect (or the interface thermal conductor (103) composed of induced heat material by electromagnetic effect or microwave effect directly producing thermal energy), or heat source device through thermal fluid indirect transmission, or heat source device through solar energy or other natural thermal energy, for simultaneously heating the interface thermal conductor (103) and the relay thermal conductor (102), and then thermal energy is transmitted to the heated second thermal body (104) via the interface thermal conductor (103), on the other hand, through the simultaneously heated relay thermal conductor (102), thermal energy is diffused to the portion of the interface thermal conductor (103) not directly contacting with the first thermal body (101), so as to be transmitted to the heated second thermal body (104);

Relay thermal conductor (102): made of material with higher thermal conductivity coefficient relative to the interface thermal conductor (103), including metal with better thermal conductivity such as gold, silver, copper, aluminum, etc., to be sandwiched in the portion of the interface thermal conductor (103) not directly contacting with the first thermal body (101), for further diffusing the thermal energy accepted by the interface thermal conductor (103) from the first thermal body (101) to the portion of the interface thermal conductor (103) not directly contacting with the first thermal body (101); and Interface thermal conductor (103): made of material suitable for contacting with the second thermal body (104) to transmit the thermal energy accepted from the first thermal body (101) to the second thermal body (104), including aluminum, iron, cast iron, stainless steel, ceramics, stone, gold, etc., for transmitting the thermal energy accepted from the first thermal body (101) to the second thermal body (104) in round-bottomed cookware structure; wherein the interface thermal conductor (103) accepts the thermal energy directly transmitted from the first thermal body (101), and the thermal energy diffused from the portion of the relay thermal conductor (102) contacting with the first thermal body (101) is accepted by the portion of the interface thermal conductor (103) which does not directly contact with the first thermal body (101) but contacts with the relay thermal conductor (102); and wherein the above round-bottomed cookware is not equipped with a lid, or equipped with the liftable lid (111); and by way of the above device, thermal energy is transmitted to the second thermal body (104) in liquid, solid, or gaseous state placed in the interface thermal conductor (103).

FIG. 12 is a main structural schematic view showing that the intercrossed multi-layered structure of the present invention is partially cross-layered combined to be boiler plant.

As shown in FIG. 12, the main components include:

First thermal body (101): related to thermal energy source through conduction, and/or convection, and/or irradiation, wherein the first thermal body (101) is constituted by various flaming heat source device, or electric heat source device, or heat source device through induced heat body by electromagnetic effect or microwave effect (or the interface thermal conductor (103) composed of induced heat material by electromagnetic effect or microwave effect directly producing thermal energy), or heat source device through thermal fluid indirect transmission, or heat source device through solar energy or other natural thermal energy, for simultaneously heating the interface thermal conductor (103) and the relay thermal conductor (102), and then thermal energy is transmitted to the heated second thermal body (104) via the interface thermal conductor (103), on the other hand, through the simultaneously heated relay thermal conductor (102), thermal energy is diffused to the portion of the interface thermal conductor (103) not directly contacting with the first thermal body (101), so as to be transmitted to the heated second thermal body (104);

Relay thermal conductor (102): made of material with higher thermal conductivity coefficient relative to the interface thermal conductor (103), including metal with better thermal conductivity such as gold, silver, copper, aluminum, etc., to be sandwiched in the portion of the interface thermal conductor (103) not directly contacting with the first thermal body (101), for further diffusing the thermal energy accepted by the interface thermal conductor (103) from the first thermal body (101) to the portion of the interface thermal conductor (103) not directly contacting with the first thermal body (101);

Interface thermal conductor (103): made of material suitable for contacting with the second thermal body (104) to transmit the thermal energy accepted from the first thermal body (101) to the second thermal body (104), including aluminum, iron, cast iron, stainless steel, ceramics, stone, gold, etc., for transmitting the thermal energy accepted from the first thermal body (101) to the second thermal body (104) in boiler plant (112) structure; wherein the interface thermal conductor (103) accepts the thermal energy directly transmitted from the first thermal body (101), and the thermal energy diffused from the portion of the relay thermal conductor (102) contacting with the first thermal body (101) is accepted by the portion of the interface thermal conductor (103) which does not directly contact with the first thermal body (101) but contacts with the relay thermal conductor (102); and Fluid inlet/outlet interface of boiler plant (113): related to fluid inlet/outlet interface installed at the boiler plant (112), such as fluid inlet/outlet piping and/or control valve; and wherein the boiler plant (112) is hermetic or semi-hermetic device heated by combustion thermal energy, electric thermal energy, or solar thermal energy, including external combustion type industrial heat pump or steam boiler, external combustion type power machinery such as boiler of steam engine, boiler of Stirling engine, solar boiler, solar water heater, stove or pot (like tea or coffee pot) with a liftable lid heated by solar energy, or boiler, water heater, or heater of heating system through combustion of heavy oil, or water heater heated by electric thermal energy or combustion of gas, alcohol, coal, or firewood, or stove or pot (like tea or coffee pot) with a liftable lid.

Figure 13:
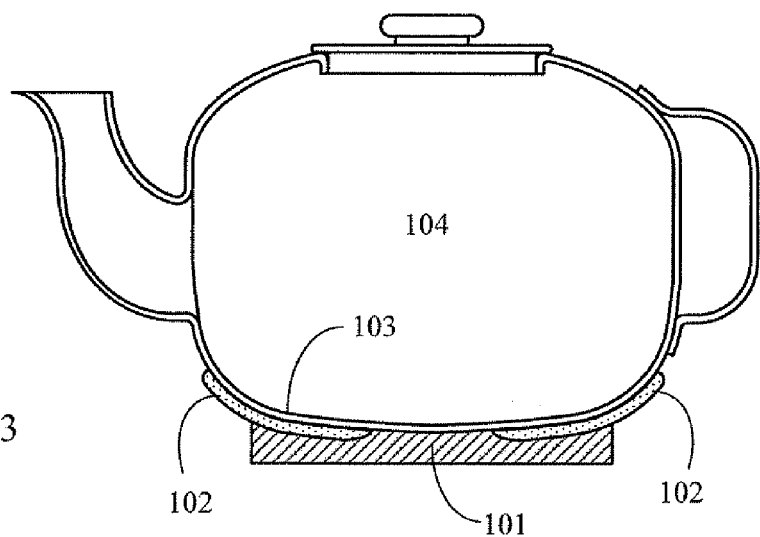
FIG. 13 is a main structural schematic view showing that the intercrossed multi-layered structure of the present invention is partially cross-layered combined to be pot plant.

FIG. 13 is a main structural schematic view showing that the intercrossed multi-layered structure of the present invention is partially cross-layered combined to be pot plant.

Figure 14:
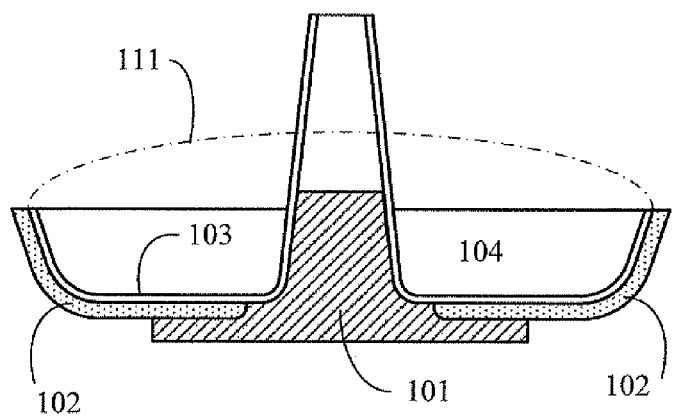
FIG. 14 is a main structural schematic view showing that the intercrossed multi-layered structure of the present invention is partially cross-layered combined to be hot pot.

FIG. 14 is a main structural schematic view showing that the intercrossed multi-layered structure of the present invention is partially cross-layered combined to be hot pot.

By way of the above device, thermal energy is transmitted to the second thermal body (104) in liquid, solid, or gaseous state placed in the interface thermal conductor (103).

Figure 15:
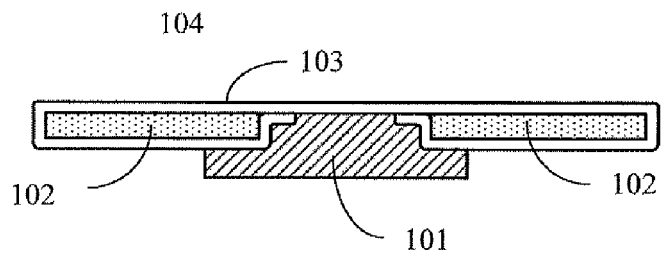
FIG. 15 is a principle schematic view showing that the intercrossed multi-layered structure of the present invention is partially cross-layered and enveloped to be thermal conductive composing structure.

For the thermal conduction principle and device for intercrossed structure having different thermal characteristics, a portion of the intercrossed multi-layered structure can be applied for being cross-layered and enveloped to be deep-bottomed cookware structure; wherein it is described in the following:

FIG. 15 is a principle schematic view showing that the intercrossed multi-layered structure of the present invention is partially cross-layered and enveloped to be thermal conductive composing structure.

As shown in FIG. 15, the main components include:

First thermal body (101): related to thermal energy source through conduction, and/or convection, and/or irradiation, wherein the first thermal body (101) is constituted by various flaming heat source device, or electric heat source device, or heat source device through induced heat body by electromagnetic effect or microwave effect (or the interface thermal conductor (103) composed of induced heat material by electromagnetic effect or microwave effect directly producing thermal energy), or heat source device through thermal fluid indirect transmission, or heat source device through solar energy or other natural thermal energy, for heating the interface thermal conductor (103), and then thermal energy is transmitted to the heated second thermal body (104) via the interface thermal conductor (103), on the other hand, through the interface thermal conductor (103) transmitting thermal energy to the relay thermal conductor (102) sandwiched in the interface thermal conductor (103), thermal energy is further diffused to the portion of the interface thermal conductor (103) not directly contacting with the first thermal body (101), so as to be transmitted to the heated second thermal body (104);

Relay thermal conductor (102): made of material with higher thermal conductivity coefficient relative to the interface thermal conductor (103), including metal with better thermal conductivity such as gold, silver, copper, aluminum, etc., to be sandwiched in the portion of the interface thermal conductor (103) not directly contacting with the first thermal body (101), for further diffusing the thermal energy accepted by the interface thermal conductor (103) from the first thermal body (101) to the portion of the interface thermal conductor (103) not directly contacting with the first thermal body (101);

Interface thermal conductor (103): made of material suitable for contacting with the second thermal body (104) to transmit the thermal energy accepted from the first thermal body (101) to the second thermal body (104), including aluminum, iron, cast iron, stainless steel, ceramics, stone, gold, etc.; wherein the interface thermal conductor (103) accepts the thermal energy directly transmitted from the first thermal body (101), and the thermal energy diffused from the relay thermal conductor (102), in which the thermal energy derives from the portion of the interface thermal conductor (103) directly contacting with the first thermal body (101), is accepted by the portion of the interface thermal conductor (103) which does not directly contact with the first thermal body (101) but contacts with the relay thermal conductor (102); and by way of the above device, thermal energy is transmitted to the second thermal body (104) in liquid, solid, or gaseous state placed in the interface thermal conductor (103).

Figure 16:
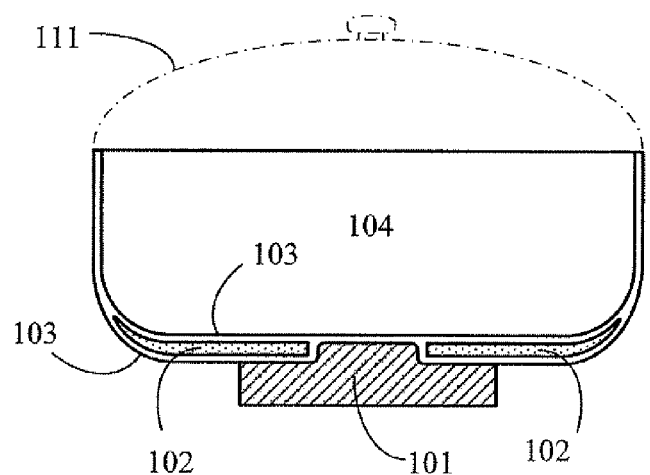
FIG. 16 is a applied structural schematic view showing that the intercrossed multi-layered structure of the present invention is partially cross-layered and enveloped to be deep-bottomed cookware.

FIG. 16 is a applied structural schematic view showing that the intercrossed multi-layered structure of the present invention is partially cross-layered and enveloped to be deep-bottomed cookware.

As shown in FIG. 16, the main components include:

First thermal body (101): related to thermal energy source through conduction, and/or convection, and/or irradiation, wherein the first thermal body (101) is constituted by various flaming heat source device, or electric heat source device, or heat source device through induced heat body by electromagnetic effect or microwave effect (or the interface thermal conductor (103) composed of induced heat material by electromagnetic effect or microwave effect directly producing thermal energy), or heat source device through thermal fluid indirect transmission, or heat source device through solar energy or other natural thermal energy, for heating the interface thermal conductor (103), and then thermal energy is transmitted to the heated second thermal body (104) via the interface thermal conductor (103), on the other hand, through the interface thermal conductor (103) transmitting thermal energy to the relay thermal conductor (102) sandwiched in the interface thermal conductor (103), thermal energy is further diffused to the portion of the interface thermal conductor (103) not directly contacting with the first thermal body (101), so as to be transmitted to the heated second thermal body (104);

Relay thermal conductor (102): made of material with higher thermal conductivity coefficient relative to the interface thermal conductor (103), including metal with better thermal conductivity such as gold, silver, copper, aluminum, etc., to be sandwiched in the portion of the interface thermal conductor (103) not directly contacting with the first thermal body (101), for further diffusing the thermal energy accepted by the interface thermal conductor (103) from the first thermal body (101) to the portion of the interface thermal conductor (103) not directly contacting with the first thermal body (101); and Interface thermal conductor (103): made of material suitable for contacting with the second thermal body (104) to transmit the thermal energy accepted from the first thermal body (101) to the second thermal body (104), including aluminum, iron, cast iron, stainless steel, ceramics, stone, gold, etc., for transmitting the thermal energy accepted from the first thermal body (101) to the second thermal body (104) in deep-bottomed cookware structure; wherein the interface thermal conductor (103) accepts the thermal energy directly transmitted from the first thermal body (101), and the thermal energy diffused from the relay thermal conductor (102), in which the thermal energy derives from the portion of the interface thermal conductor (103) directly contacting with the first thermal body (101), is accepted by the portion of the interface thermal conductor (103) which does not directly contact with the first thermal body (101) but contacts with the relay thermal conductor (102); and wherein the above deep-bottomed cookware is not equipped with a lid, or equipped with the liftable lid (111); and by way of the above device, thermal energy is transmitted to the second thermal body (104) in liquid, solid, or gaseous state placed in the interface thermal conductor (103).

Figure 17:
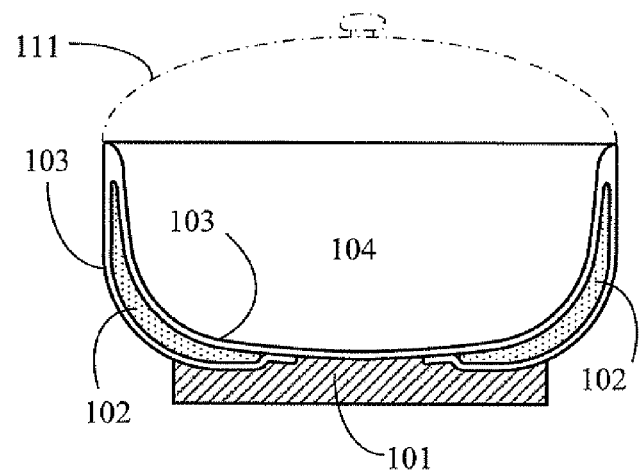
FIG. 17 is a applied structural schematic view showing that the intercrossed multi-layered structure of the present invention is partially cross-layered and enveloped to be bowl cookware.

FIG. 17 is a applied structural schematic view showing that the intercrossed multi-layered structure of the present invention is partially cross-layered and enveloped to be bowl cookware.

As shown in FIG. 17, the main components include:

First thermal body (101): related to thermal energy source through conduction, and/or convection, and/or irradiation, wherein the first thermal body (101) is constituted by various flaming heat source device, or electric heat source device, or heat source device through induced heat body by electromagnetic effect or microwave effect (or the interface thermal conductor (103) composed of induced heat material by electromagnetic effect or microwave effect directly producing thermal energy), or heat source device through thermal fluid indirect transmission, or heat source device through solar energy or other natural thermal energy, for heating the interface thermal conductor (103), and then thermal energy is transmitted to the heated second thermal body (104) via the interface thermal conductor (103), on the other hand, through the interface thermal conductor (103) transmitting thermal energy to the relay thermal conductor (102) sandwiched in the interface thermal conductor (103), thermal energy is further diffused to the portion of the interface thermal conductor (103) not directly contacting with the first thermal body (101), so as to be transmitted to the heated second thermal body (104);

Relay thermal conductor (102): made of material with higher thermal conductivity coefficient relative to the interface thermal conductor (103), including metal with better thermal conductivity such as gold, silver, copper, aluminum, etc., to be sandwiched in the portion of the interface thermal conductor (103) not directly contacting with the first thermal body (101), for further diffusing the thermal energy accepted by the interface thermal conductor (103) from the first thermal body (101) to the portion of the interface thermal conductor (103) not directly contacting with the first thermal body (101); and Interface thermal conductor (103): made of material suitable for contacting with the second thermal body (104) to transmit the thermal energy accepted from the first thermal body (101) to the second thermal body (104), including aluminum, iron, cast iron, stainless steel, ceramics, stone, gold, etc., for transmitting the thermal energy accepted from the first thermal body (101) to the second thermal body (104) in bowl cookware structure; wherein the interface thermal conductor (103) accepts the thermal energy directly transmitted from the first thermal body (101), and the thermal energy diffused from the relay thermal conductor (102), in which the thermal energy derives from the portion of the interface thermal conductor (103) directly contacting with the first thermal body (101), is accepted by the portion of the interface thermal conductor (103) which does not directly contact with the first thermal body (101) but contacts with the relay thermal conductor (102); and wherein the above bowl cookware is not equipped with a lid, or equipped with the liftable lid (111); and by way of the above device, thermal energy is transmitted to the second thermal body (104) in liquid, solid, or gaseous state placed in the interface thermal conductor (103).

Figure 18:
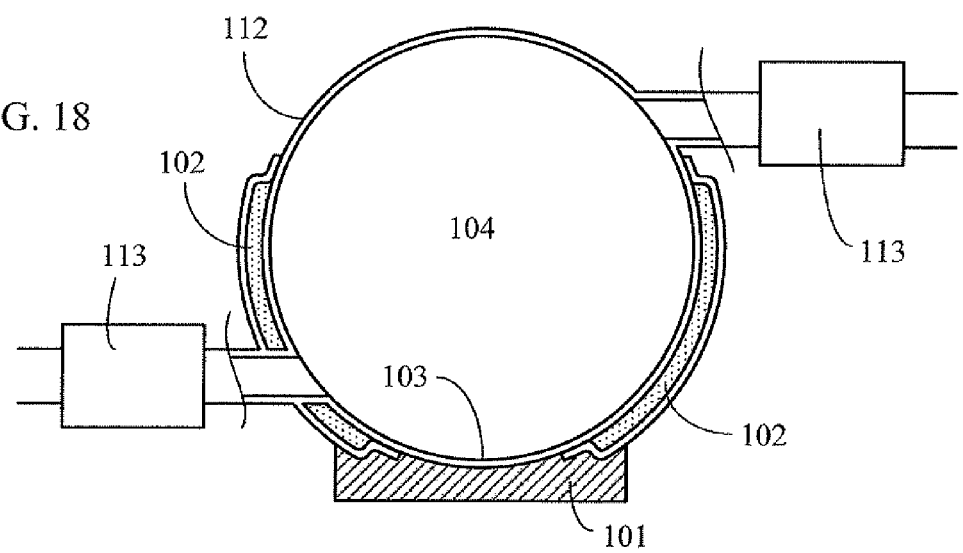
FIG. 18 is a applied structural schematic view showing that the intercrossed multi-layered structure of the present invention is partially cross-layered and enveloped to be boiler plant.

FIG. 18 is a applied structural schematic view showing that the intercrossed multi-layered structure of the present invention is partially cross-layered and enveloped to be boiler plant.

As shown in FIG. 18, the main components include:

First thermal body (101): related to thermal energy source through conduction, and/or convection, and/or irradiation, wherein the first thermal body (101) is constituted by various flaming heat source device, or electric heat source device, or heat source device through induced heat body by electromagnetic effect or microwave effect (or the interface thermal conductor (103) composed of induced heat material by electromagnetic effect or microwave effect directly producing thermal energy), or heat source device through thermal fluid indirect transmission, or heat source device through solar energy or other natural thermal energy, for heating the interface thermal conductor (103), and then thermal energy is transmitted to the heated second thermal body (104) via the interface thermal conductor (103), on the other hand, through the interface thermal conductor (103) transmitting thermal energy to the relay thermal conductor (102) sandwiched in the interface thermal conductor (103), thermal energy is further diffused to the portion of the interface thermal conductor (103) not directly contacting with the first thermal body (101), so as to be transmitted to the heated second thermal body (104);

Relay thermal conductor (102): made of material with higher thermal conductivity coefficient relative to the interface thermal conductor (103), including metal with better thermal conductivity such as gold, silver, copper, aluminum, etc., to be sandwiched in the portion of the interface thermal conductor (103) not directly contacting with the first thermal body (101), for further diffusing the thermal energy accepted by the interface thermal conductor (103) from the first thermal body (101) to the portion of the interface thermal conductor (103) not directly contacting with the first thermal body (101);

Interface thermal conductor (103): made of material suitable for contacting with the second thermal body (104) to transmit the thermal energy accepted from the first thermal body (101) to the second thermal body (104), including aluminum, iron, cast iron, stainless steel, ceramics, stone, gold, etc., for transmitting the thermal energy accepted from the first thermal body (101) to the second thermal body (104) in the boiler plant (112) structure; wherein the interface thermal conductor (103) accepts the thermal energy directly transmitted from the first thermal body (101), and the thermal energy diffused from the relay thermal conductor (102), in which the thermal energy derives from the portion of the interface thermal conductor (103) directly contacting with the first thermal body (101), is accepted by the portion of the interface thermal conductor (103) which does not directly contact with the first thermal body (101) but contacts with the relay thermal conductor (102); and Fluid inlet/outlet interface of boiler plant (113): related to fluid inlet/outlet interface installed at the boiler plant (112), such as fluid inlet/outlet piping and/or control valve; and wherein the boiler plant (112) is hermetic or semi-hermetic device heated by combustion thermal energy, electric thermal energy, or solar thermal energy, including external combustion type industrial heat pump or steam boiler, external combustion type power machinery such as boiler of steam engine, boiler of Stirling engine, solar boiler, solar water heater, stove or pot (like tea or coffee pot) with a liftable lid heated by solar energy, or boiler, water heater, or heater of heating system through combustion of heavy oil, or water heater heated by electric thermal energy or combustion of gas, alcohol, coal, or firewood, or stove or pot (like tea or coffee pot) with a liftable lid.

Figure 19:
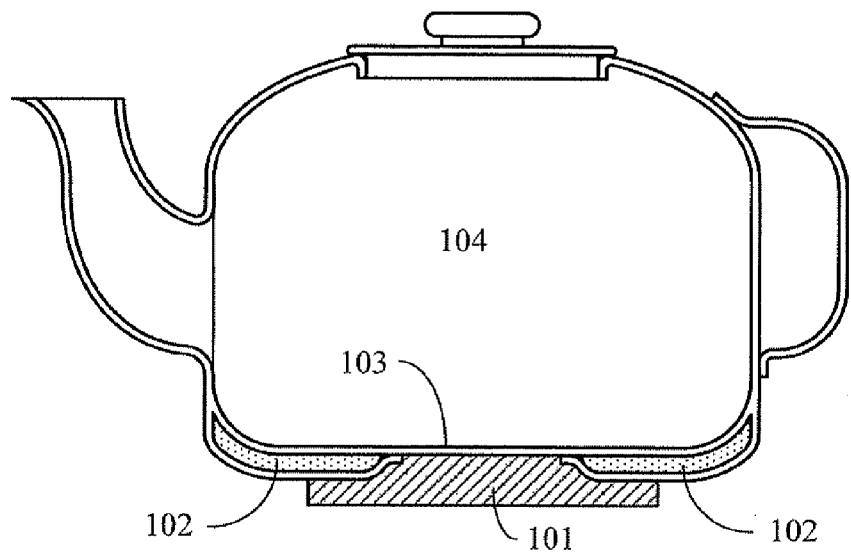
FIG. 19 is a applied structural schematic view showing that the intercrossed multi-layered structure of the present invention is partially cross-layered and enveloped for pot plant.

FIG. 19 is a applied structural schematic view showing that the intercrossed multi-layered structure of the present invention is partially cross-layered and enveloped for pot plant.

Figure 20:
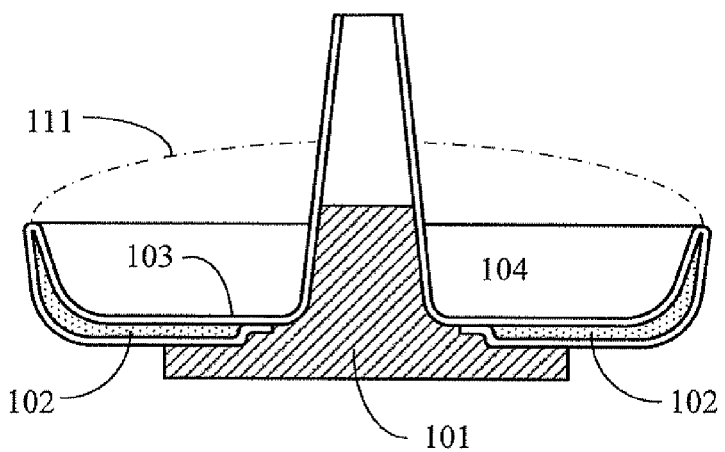
FIG. 20 is a applied structural schematic view showing that the intercrossed multi-layered structure of the present invention is partially cross-layered and enveloped to be hot pot.

FIG. 20 is a applied structural schematic view showing that the intercrossed multi-layered structure of the present invention is partially cross-layered and enveloped to be hot pot.

By way of the above device, thermal energy is transmitted to the second thermal body (104) in liquid, solid, or gaseous state placed in the interface thermal conductor (103).

The relay thermal conductor (102) as shown in the embodiments of FIGS. 10~20 further includes the following specific structure:

Relay thermal conductor (102): composed of ring structures of circular, triangular, square, or more surface shape, wherein the relay thermal conductor (102) combines with the bottom of the interface thermal conductor (103) at the position facing the first thermal body (101), the heating surface facing the first thermal body (101) is ring-shaped with diminishing aperture toward the heating surface of the interface thermal conductor (103), the relay thermal conductor (102) is ring structure with radial expansion, and the feature is that the more away from the center of the circle, the thinner the thickness is.

For the thermal conduction principle and device for intercrossed structure having different thermal characteristics and/or the intercrossed multi-layered structure partially cross-layered and enveloped to be thermal conductive composing structure, the thermal conducting or heat dissipating assembled structure can be constituted by the first thermal body (101) in solid state, the relay thermal conductor (102), the interface thermal conductor (103), the second thermal body (104) in solid state, and/or the thermal conductive interlayer (110) utilizing thermal conductive material in gradually layered structure arranged according to the required thermal conductive characteristics of the multi-layered structure, wherein if all or partially neighboring thermal conductors constituting the thermal conducting or heat dissipating assembled structure are solid state material, the combining methods between the two neighboring thermal conductors include one or more of the following:

(1) fastened by external screws and nuts; and/or
(2) mutually threaded by spiral post and spiral hole structure; and/or
(3) mutually threaded by spiral post and spiral hole structure for prestressed-clamping combination; and/or
(4) riveting combination; and/or
(5) lamination combination; and/or
(6) fastened and clamping combination; and/or
(7) adhesive combination; and/or
(8) welding combination; and/or
(9) casting combination; and/or
(10) clamping combination; and/or
(11) tabling combination; and/or
(12) powder sintering combination; and/or
(13) friction and fusion combination; and/or
(14) neighboring thermal conductors are castedly combined; and/or
(15) neighboring thermal conductors are electroplatedly combined; and/or
(16) the thermal conducting structure between neighboring thermal conductors and another thermal conductor is fixedly or movably attaching combination; and/or
(17) neighboring thermal conductors are tightly touchingly combined by gravity; and/or
(18) neighboring thermal conductors are tightly touchingly combined by attraction of magnet device; and/or
(19) neighboring thermal conductors are combined as an enclosed structure.

For the thermal conduction principle and device for intercrossed structure having different thermal characteristics, one or more auxiliary thermal conducting methods can be optionally selected to be applied between the first thermal body (101) and the relay thermal conductor (102); or between the relay thermal conductor (102) and the interface thermal conductor (103); or between the interface thermal conductor (103) and the second thermal body (104); or between the relay thermal conductor (102) and the thermal conductive interlayer (110) if thermal conductive interlayer (110) installed; or between the thermal conductive interlayer (110) and the thermal conductive interlayer (110) if multiple layered thermal conductive interlayers (110) are installed; or between the thermal conductive interlayer (110) and the interface thermal conductor (103), including:

1. to be installed with electrically insulated heat conductive piece; or
2. to be coated with thermally conductive grease; or
3. to be installed with electrically insulated thermal conductive piece and coated with thermally conductive grease.

The thermal conduction principle and device for intercrossed structure having different thermal characteristics of the present invention can be applied for various heat absorbing or dissipating, or cooling thermal conductive application devices, such as heat absorption and dissipation of various machine casings, structure casings, semiconductor components, or the heat absorption, heat dissipation or thermal energy conduction of ventilation devices, information, audio or image devices, or heat dissipation of various lamp or LED devices, or the heat absorption or dissipation or thermal energy conduction of air conditioning devices, electrical machines or engine, or heat dissipation of thermal energy conduction from frictional heat loss of the mechanical devices, or heat dissipation or thermal energy conduction of flaming, electric, or solar heater, or other home appliances, or flaming, electric, or solar cookware, or heat absorption or thermal energy conduction of boiler, boilers of external combustion type power machinery and Stirling engine, or home stoves, or cookware, or water heater heated by flaming, electric or solar energy, or heat absorption, heat dissipation or thermal energy conduction of earth layer or water thermal energy, plant or housing building or building material or building structure devices, or heat absorbing or dissipation of water tower, or heat absorption, heat dissipation or thermal energy conduction of batteries or fuel cells, etc;

or it can be applied for thermal energy conduction in home appliances, industrial products, electronic products, electrical machines or mechanical devices, power generation equipments, buildings, air conditioning devices, industrial equipments or industrial manufacturing process.

The invention claimed is:

1. A multi-layer thermally conductive structure including a plurality of partially overlapping conductors having different thermal conducting characteristics, comprising:

a relay thermal conductor having a first surface that contacts and is thermally coupled with a first thermal body;
an interface thermal conductor between said relay thermal conductor and a second thermal body, said second thermal body contacting only the interface thermal conductor and not the relay thermal conductor, said interface thermal conductor having a first surface that contacts and is thermally coupled with the second thermal body, said relay thermal conductor and interface thermal conductor conducting heat between the first thermal body and the second thermal body when there is a temperature difference between the first thermal body and the second thermal body, and said interface thermal conductor having one of the following thermal characteristics:
(i) a higher specific heat capacity than the relay thermal conductor;
(ii) a coefficient of heat transfer to the second thermal body that is higher than a coefficient of thermal transfer from the relay thermal conductor to the second thermal body; and
(iii) a higher thermal emissivity to the second thermal body than to the relay thermal conductor,
wherein the interface thermal conductor has a second surface that, like said first surface of the relay thermal conductor, contacts and is thermally coupled with the first thermal body,
wherein the first thermal body is either a heat absorber or a heat source and the second thermal body is also either a heat absorber or a heat source, and
wherein relative contact areas between the relay thermal conductor, the interface thermal conductor, and the first and second thermal bodies determines thermal conduction properties of the multi-layer thermally conductive structure,
wherein a thermal conducting surface of the first thermal body (101) is partially in contact with the relay thermal conductor (102) and partially in contact with the interface thermal conductor (103),
wherein a thermal conductive surface of the relay thermal conductor (102) is partially in contact with the first thermal body (101) and partially in contact with the interface thermal conductor (103), said interface thermal conductor including a central section that extends through the relay thermal conductor to contact the first thermal body,
wherein the first thermal body is an external heat source, and
wherein the relay thermal conductor is made of a metal having a higher thermal conductivity than the interface thermal conductor and is sandwiched between the first thermal body and a portion of the interface thermal conductor that does not directly contact the first thermal body to diffuse thermal energy received by the relay thermal conductor from the first thermal body toward the interface thermal conductor.

2. A multi-layer thermally conductive structure as claimed in claim 1, the thermally conductive structure is included in one of the following heat absorbing, heat dissipation, or cooling structures of devices: machine casings; heat pipe structures; structural casings; semiconductor components; ventilation devices; information, audio, or image devices; lamps or LED devices; air conditioning devices; electrical machines or engines; mechanical devices that produce frictional heat losses; electric heaters, home appliances, or cooking devices; flame heating stoves; thermal energy installations; factories, houses, or other structures; water towers; and batteries or fuel cells.

3. A multi-layer thermally conductive structure as claimed in claim 1, wherein the thermally conductive structure is applied to round-bottomed cookware that lacks a lid or is equipped with a liftable lid.

4. A multi-layer thermally conductive structure as claimed in claim 1, wherein the relay thermal conductor is made of gold, silver, copper, or aluminum.

5. A multi-layer thermally conductive structure as claimed in claim 1, wherein the interface thermal conductor is made of aluminum, iron, cast iron, stainless steel, ceramics, stone, or gold.

6. A multi-layer thermally conductive structure as claimed in claim 1, wherein the thermally conductive structure is applied to a fluid inlet/outlet interface of a boiler, and wherein the boiler is a hermetic or semi-hermetic device.

7. A multi-layer thermally conductive structure as claimed in claim 1, wherein the interface thermal conductor includes a liquid, solid, or gas for transmitting thermal energy to the second thermal body.

8. A multi-layer thermally conductive structure as claimed in claim 1, wherein the relay thermal conductor includes a ring structure having an aperture whose diameter decreases between a surface that faces the first thermal body and a surface that faces the interface thermal conductor, and wherein a thickness of the relay thermal conductor decreases with distance away from the aperture.

9. A multi-layer thermally conductive structure as claimed in claim 1, wherein said thermal conductors are joined by one of the following structures:
  a. external screws or nuts;
  b. a mutually threaded spiral post and hole structure;
  c. a prestressed-clamping combination with a mutually threaded spiral post and hole structure;
  d. a rivet structure;
  e. a lamination structure;
  f. a fastener and clamp combination structure;
  g. an adhesive structure;
  h. a welded structure;
  i. a cast structure;
  j. a clamping structure;
  k. a table structure;
  l. a sintered powder structure;
  m. a friction and fusion structure;
  n. common casting of neighboring thermal conductors;
  o. an electroplating structure;
  p. a fixed or movable attachment structure;
  q. a structure that involves gravity;
  r. a magnetic structure; and
  s. an enclosure.

* * * * *